(12) United States Patent
Lanz et al.

(10) Patent No.: US 7,265,646 B2
(45) Date of Patent: *Sep. 4, 2007

(54) TAMPER-RESISTANT FILTER

(75) Inventors: Charles N. Lanz, Oneida, NY (US); Eric J. Purdy, Constantia, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 205 days.

This patent is subject to a terminal disclaimer.

(21) Appl. No.: 11/070,984

(22) Filed: Mar. 3, 2005

(65) Prior Publication Data

US 2005/0275485 A1    Dec. 15, 2005

Related U.S. Application Data

(63) Continuation-in-part of application No. 10/865,118, filed on Jun. 10, 2004, now Pat. No. 7,005,945.

(51) Int. Cl.
*H03H 7/01* (2006.01)

(52) U.S. Cl. ........................................ 333/185; 333/176
(58) Field of Classification Search ................ 333/12, 333/176, 182, 183, 185; 439/607, 620, 638, 439/911

See application file for complete search history.

(56) References Cited

U.S. PATENT DOCUMENTS

| 5,278,525 | A | 1/1994 | Palinkas |
| 5,632,651 | A | 5/1997 | Szegda |
| 6,529,103 | B1 | 3/2003 | Brendel et al. |
| 6,759,927 | B2 | 7/2004 | Maguire et al. |
| 7,005,945 | B2 * | 2/2006 | Lanz et al. ................. 333/185 |

* cited by examiner

*Primary Examiner*—Robert Pascal
*Assistant Examiner*—Kimberly E Glenn
(74) *Attorney, Agent, or Firm*—Marjama & Bilinski LLP (57) ABSTRACT

Method and apparatus for protecting a filter trap that is utilized in a coaxial cable system against theft of service. A barrier is mounted inside a filter housing which includes a pair of end connectors that are aligned along a common axis. The barrier is mounted on one or both end faces plate or isolation shield for intercepting a cutting tool moving along the axis to direct the tool away from the axis. At least one opening in the plate adjacent to the barrier engages the intercepted cutting tool and further directs the tool away from the axis causing the tool to break or to prevent the formation of a passage between the end connectors.

21 Claims, 5 Drawing Sheets

TAMPER-RESISTANT FILTER

CROSS REFERENCE TO RELATED APPLICATION

This application is a continuation in part of U.S. Ser. No. 10/865,118 filed Jun. 10, 2004 now U.S. Pat. No. 7,005,945.

FIELD OF THE INVENTION

This invention relates to a filter or trap suitable for use in a cable system and, in particular, to an apparatus for preventing the theft of service from a cable system having filters or traps for preventing specific data carrying frequencies from reaching a subscriber's location in a usable form.

BACKGROUND OF THE INVENTION

Figure 1:
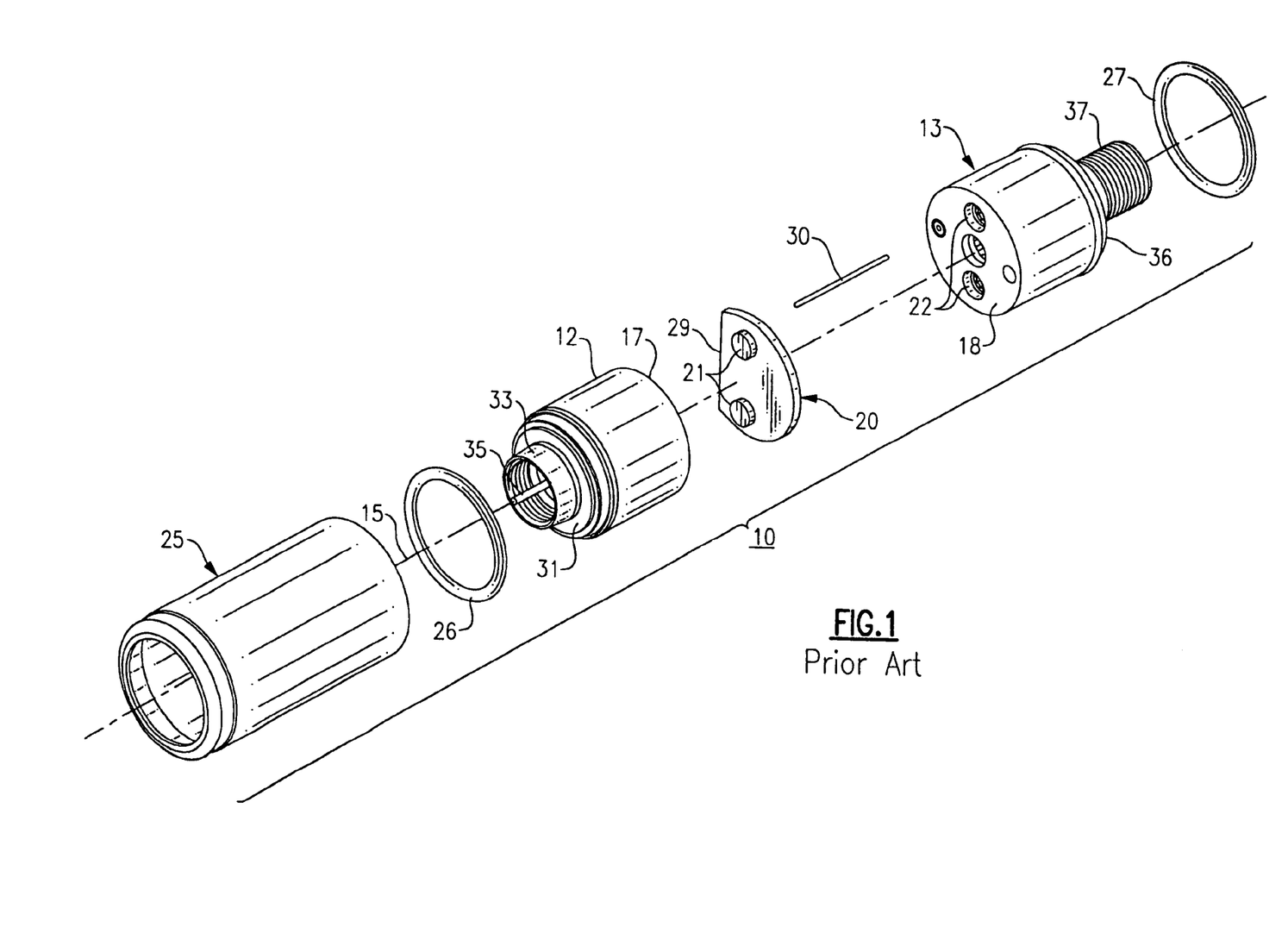
FIG. 1 is an exploded view in perspective showing a prior art filter or trap assembly that contains a pair of back to back filter housing sections that share a common axis.

An improved filter or trap for use in a cable system is disclosed in U.S. Pat. No. 5,278,525 to Palinkas, the disclosure of which is incorporated herein by reference. The Palinkas device is illustrated in FIG. 1 and is generally referenced 10. The device includes a pair of housing sections 12 and 13 each of which contains filter components for removing or attenuating signals at selected frequencies so that the selected signals will not reach a subscriber's location in a usable form. The housing sections are coaxially aligned along a common center axis 15 with the adjacent end walls 17 and 18 of the housing sections being mounted in close proximity to one another. An electrical isolation shield 20 is mounted between the housing sections to maintain separation between the two and to prevent flux generated by the filters from crossing over between the housing sections. The isolation shield is a generally disc or plate shaped member having opposed end faces that are typically perpendicularly aligned with reference to the common axis 15. A pair of off-axis keys 21-21 are carried upon each end face of the shield which mate with complementary keyways 22-22 formed in the adjacent end walls of the two housing sections. The two filter housing sections and the isolation shield are, in assembly, contained within a tubular sleeve 25 and suitable gaskets 26 and 27 are provided at the two ends of the sleeve to prevent moisture and other contaminants from passing between the sleeve and the housing sections.

A cut out 29 is provided in the shield which permits an off-axis electrical lead 30 to pass between the housing sections. Housing section 12 is equipped with an end cap 31 having a female threaded connector 33 containing a terminal pin 35 that enables the filter assembly to be coupled to a coaxial cable having a conductor carrying the cable signal or other piece of equipment such as a tap or distribution box. The second housing section 13 contains an end cap 36 having a male threaded connector 37 which contains a connector terminal (not shown) for coupling the filter assembly to another coaxial cable or piece of equipment.

Theft of service has long been a problem in the cable industry. Most distribution boxes or taps servicing most cable systems are readily accessible to the general public. All the signals provided by the network are carried to the tap on the provider's cable. However, only the signals that are paid for by a subscriber are tapped onto the subscribers cable, the remaining signal being blocked or attenuated by filters or traps that are typically located in or near the distribution box.

If a subscriber wishes to gain illegal access to the blocked or attenuated signals, he or she can simply remove the blocking or attenuating filters and connect the subscriber's cable directly to the tap input. This type of tampering with the tap connection is, however, easily detected by a visual inspection of the distribution box.

It has been found, however, that prior art filter assemblies, such as described in the above noted Palinkas patent, can be circumvented in manners that are not easily detected by a visual inspection. This may be achieved by removing the filter assembly from the tap and drilling or otherwise creating a passage running along the commonly shaped axis between the two end connectors of the assembly and bypassing the filter components. The center conductor of a coaxial cable can then be passed through the passage between the connectors to bypass the filter components. The assembly, so altered, is then reinstalled in the distribution box in its original location. A service person inspecting the system can see the filter assembly is in place and without further inspection, it is assumed it is working properly to block or attenuate signal at the tuned frequencies.

SUMMARY OF THE INVENTION

It is a primary object of the present invention to improve cable systems.

It is a further object of the present invention to prevent the theft of service of a cable system.

A still further object of the present invention to prevent alteration of a cable system filter or trap is such a manner that the filter will pass a visual inspection.

Another object of the present invention is to impede the ability to create an internal passage running between the end connectors of a filter or trap to prevent a shunt from being installed between the input and output connectors of the trap which would defeat the filter network.

These and other objects of the invention are attained by method and apparatus for protecting a cable system against theft of service. In one embodiment of the invention, a filter assembly containing a pair of filter housing sections is mounted in end to end alignment along a common axis. A first cable connector is mounted at one end of the assembly and a second cable connector is mounted at the other end of the assembly with both connectors being coaxially aligned along the common axis. A shield having two opposed end faces is mounted between the two filter housing sections with the end faces being perpendicularly aligned with respect to the common axis. A barrier is mounted upon the shield that has a surface that is arranged to intercept a cutting tool, such as a drill bit, that is moving along the common axis to prevent the tool from reaching the other connector.

In another embodiment of the invention the shield is mounted inside of a single filter housing between a pair of end connectors that share a common axis. Here again the shield has flat end faces that are generally perpendicular to the common axis. A barrier is mounted upon one or both of the faces so as to intercept a cutting tool that is moving along the common axis and to direct the tool away from the axis to either break the tool or divert the tool along a path of travel such that a passage is not established between the connectors.

In further embodiments, the shield may incorporate, in addition to the barrier at least one or more off-centered slots or holes that engage and redirect a cutting tool away from the center axis of the filter or trap. Once engaged in a slot or hole further advancement of the cutting tool will not create a central passage through the filter and may cause exert enough lateral force to break the cutting tool or otherwise render such tool useless.

BRIEF DESCRIPTION OF THE DRAWINGS

For a better understanding of these and objects of the invention, reference will be made to the following detailed description of the invention which is to be read in association with the accompanying drawing, wherein.

DETAILED DESCRIPTION OF THE INVENTION

Figures 2, 3, 4:
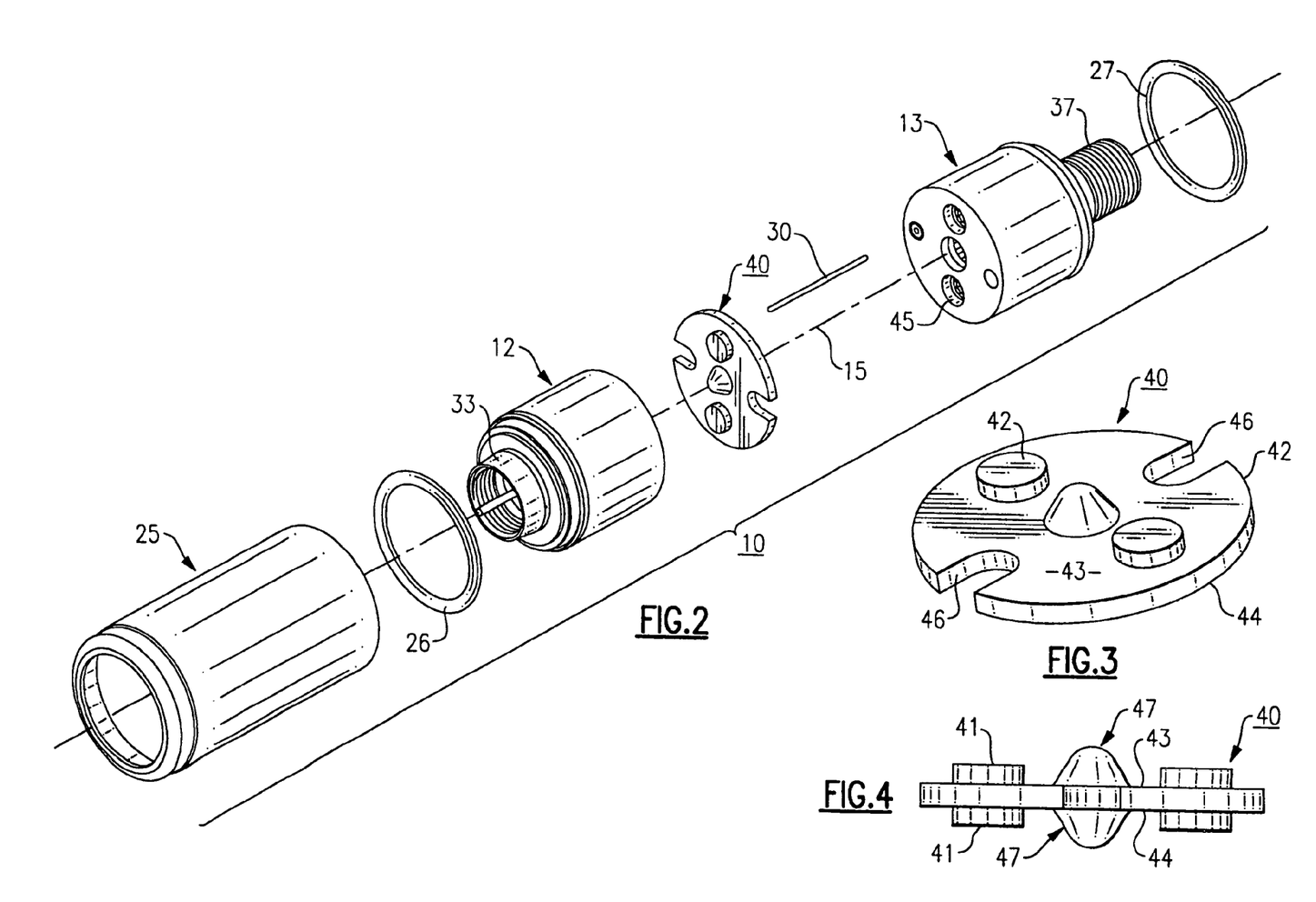
FIG. 2 is an exploded view in perspective illustrates a filter or trap assembly similar to that shown in FIG. 1 which embodies the teachings of the present invention.
FIG. 3 is an enlarged perspective view of a shield suitable for use in the present invention.
FIG. 4 is a side elevation of the shield illustrated in FIG. 3.

Turning now to FIG. 2, there is illustrated a filter or trap assembly of the type disclosed in the previously mentioned Palinkas patent and shown in FIG. 1 wherein like elements described in reference to FIG. 1 are identified with like numerals in FIG. 2. Here again a pair of filter housing sections 12 and 13 are coaxially aligned along a common axis 15 and are mounted in a back to back relationship with a sleeve 25. An electrical isolation shield 40 is positioned between the two filter housing sections which has been modified to prevent a cutting tool, such as a drill bit or a reamer, from creating an internal passage along the common axis between the two end connectors 33 and 37 through which a shunt can be passed to establish a direct connection between the network input to the tap and a subscriber's cable thus circumventing the filter network.

The modified isolation shield 40 is shown in further detail in FIGS. 3 and 4. The shield includes a circular disc 41 that conforms to internal contour of sleeve 15. The disc is fabricated of an electrical insulating material that will prevent flux generated in one of the housing sections from passing over into the adjacent housing section and thus degrading the effective functioning of the filter or trap. Circular keys 42-42 are mounted on the opposed end faces 43 and 44 of the shield which are arranged to mate with suitable keyways 45 formed in the adjacent end walls of the two housing sections. Cutouts 46 are also provided in the shield to allow an electrical lead 30 to pass between the two housing sections.

In this embodiment of the invention, a barrier generally referenced 47 is centrally mounted on either end face of the disc. The barrier has convex shaped dome profile with the apex of the dome being centered upon the common axis 15 of the filter in assembly. Preferably, the barrier is formed of a hardened material that will resist penetration by a cutting tool such as a drill bit. A tool that is advanced along the common axis through one of the connectors will thus be intercepted by the dome and directed away from the common axis. Because of the relatively small size of the connector opening found in most filters or traps, a tool, such as a drill, that is passed into the filter through the connector opening will start to bend when it is diverted away from the common axis by the barrier. Due to the contour of the dome, the drill will either break eventually or be diverted sufficiently so that a passage will not be completed between the end connectors.

Figure 5:
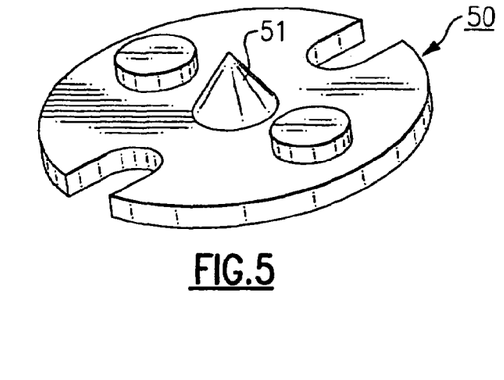
FIG. 5 is a perspective view of a second embodiment of a shield suitable for use in the practice of the present invention.
Figure 6:
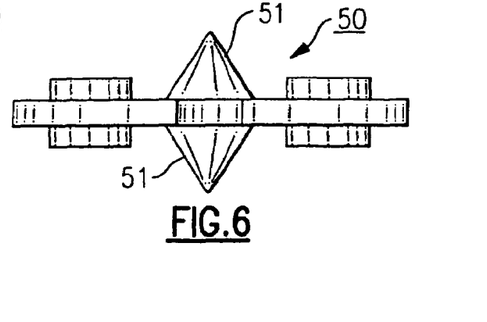
FIG. 6 is a side elevation of the shield illustrated in FIG. 5.

FIGS. 5 and 6 illustrate a further embodiment of the invention in which an insulation shield referenced 50 of the general configuration described above is equipped with a conical shaped barriers 51. Here again, the apex to the cone is centered upon the common axis of the filter in assembly. The barrier is fabricated of a hardened material so that a cutting tool that is intercepted by the cone will be turned away from the common axis at an angle to induce breakage of the tool or precluding a passage from being completed between the end connectors.

Figure 7:
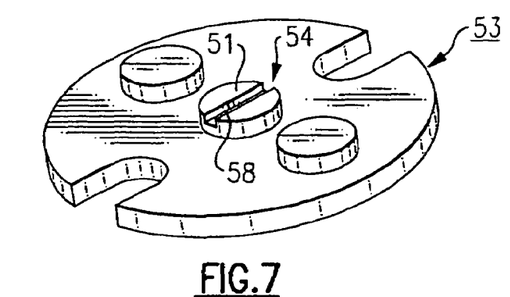
FIG. 7 is a perspective view showing a third shield suitable for use in the practice of the present invention.
Figure 8:
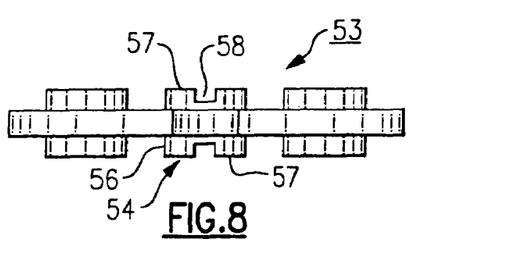
FIG. 8 is a side elevation of the shield illustrated in FIG. 6.

A still further embodiment of the invention is illustrated in FIGS. 7 and 8. In this embodiment the shield 53 contains a barrier 54 having a cylindrical body 56. The body, in turn, has a flat top surface 57 having a channel 58 extending across the top surface of the barrier. The body of the barrier is center upon the common axis 15 of the filter so that the channel cuts across the axis. The channel is profiled to capture the tip of a cutting tool such as a drill bit. Once captured, the rotation of the bit will cause the bit to walk along the channel away from the common axis again inducing tool breakage or preventing a passage between the end connectors from being completed.

Figure 9:
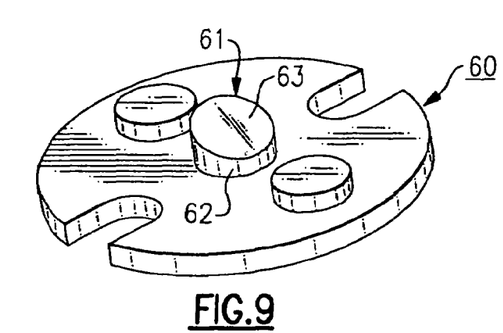
FIG. 9 is a perspective view further illustrating a forth shield suitable for use in the practice of the present invention.
Figure 10:
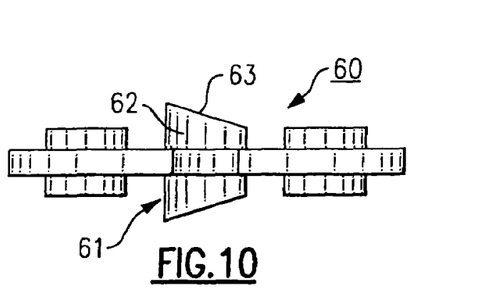
FIG. 10 is a side elevation of the shield illustrated in FIG. 8.

Yet another embodiment of the invention is illustrated in FIGS. 9 and 10 wherein the isolation shield 60 contains a barrier 61 centered on each of its end faces. The barrier includes a cylindrical body 62 that contains an inclined flat top surface 63 that passes through the common axis 15 of the filter in assembly. The inclined surface is hardened so that a cutting tool, such as a drill bit, moving along the common axis will be intercepted by the surface and directed away from the common axis to induce tool breakage or prevent a passage from being formed between the end connectors of the filter assembly.

Figure 11:
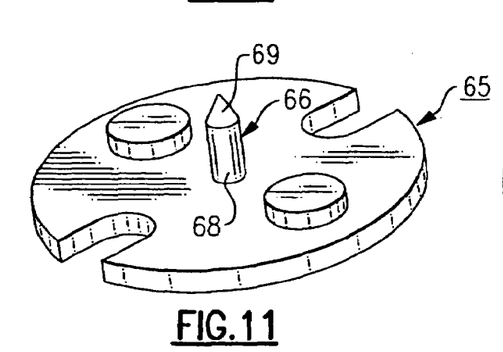
FIG. 11 is a perspective view showing a further embodiment of a fifth shield suitable for use in the practice of the present invention.
Figure 12:
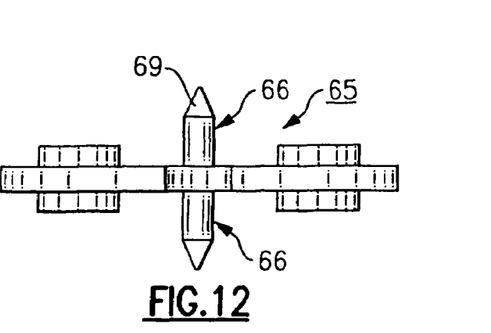
FIG. 12 is a side elevation of the shield illustrated in FIG. 11.

A further embodiment of the invention is illustrated in FIGS. 11 and 12. The isolation shield 65 in this case contains a barrier 66 centered on either side of the shield. The barrier includes a hardened steel rod 68 that terminates in a relatively sharp point 69. The tip of the point, in assembly is centered upon the common axis of the filter and will thus intercept a cutting tool moving along the axis and direct the tool away from the axis at an angle to induce tool breakage or to prevent a passage from being created between the connectors.

Figure 13:
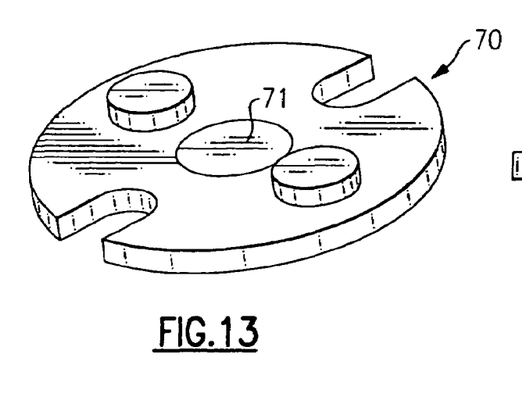
FIG. 13 is a perspective view showing a sixth shield embodiment.
Figure 14:
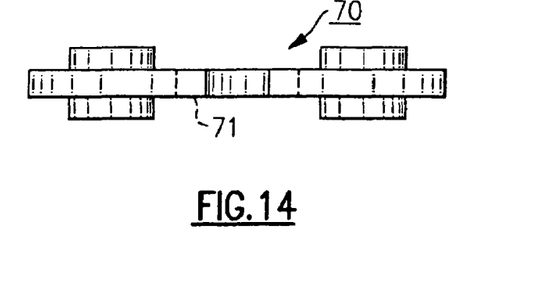
FIG. 14 is a side elevation of the shield shown in FIG. 13.

FIGS. 13 and 14 illustrate yet another embodiment of the invention wherein the shield 70 contains a harden disc 71 which in assembly is centered upon the common axis 15 of the filter assembly. The hardened disc may be integral with the shield or may be secured to the shield by any suitable means. The disc has a hardness such that it will resist penetration of the drill bit.

Figure 15:
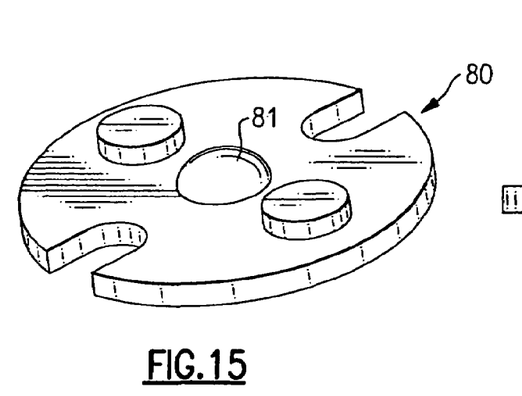
FIG. 15 is a perspective view showing a further embodiment of the invention.
Figure 16:
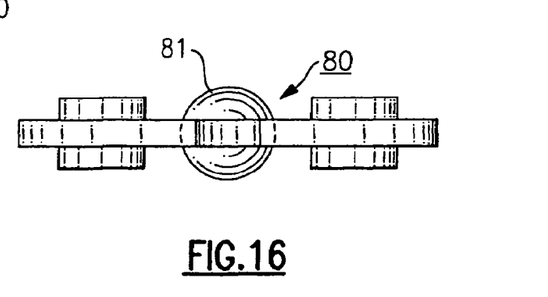
FIG. 16 is a side elevation of the shield shown in FIG. 15.

FIGS. 15 and 16 illustrate a shield 80 that contains a harden ball 81 centrally mounted within the shield so that the ball is axially aligned with common axis 15 of the filter. Here again, a tool that is moving along the axis in either direction will be intercepted by the ball and directed away from the axis to induce breakage of the tool.

Figure 18:
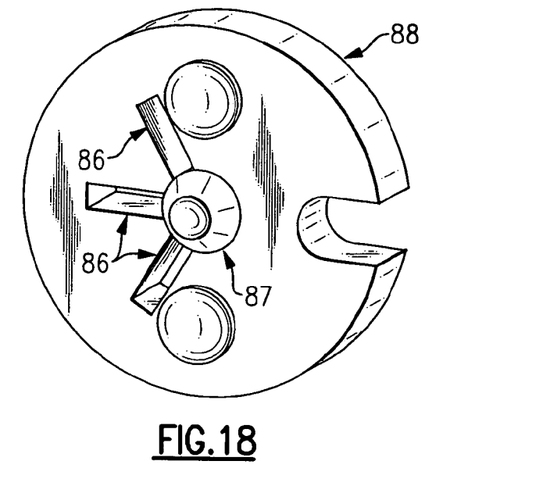
FIG. 18 is a perspective view of showing a eighth shield embodiment.

FIG. 18 illustrates a further embodiment of the invention in which an insulation shield referenced 85 of the general configuration described above includes at least one opening, which in this embodiment is shown as a radial slot 86. The barrier 87 can take the shape of any of the previous embodiments, but in this embodiment is depicted as a convex shaped dome with the apex of the dome being centered upon the common axis of the filter assembly. As a cutting tool is advanced along the common axis through one of the connectors, the barrier 87 will intercept the tool and direct it away from the common axis and preferably toward the opening. The opening or slot is positioned adjacent the barrier so as to engage the advancing tool and further direct the tool off-center to induce breakage of the tool or to prevent a passage from being formed along the common axis of the filter.

A still further embodiment of the invention is illustrated in FIG. 18. The isolation shield 88 and barrier 87 are of similar structure to those depicted in FIG. 17. However, in this embodiment, multiple slots 86 are placed adjacent to the barrier to increase the likelihood that the redirected cutting tool engages one of the slots to induce breakage of the tool and prevent the formation of a passage along the common axis.

Figure 19:
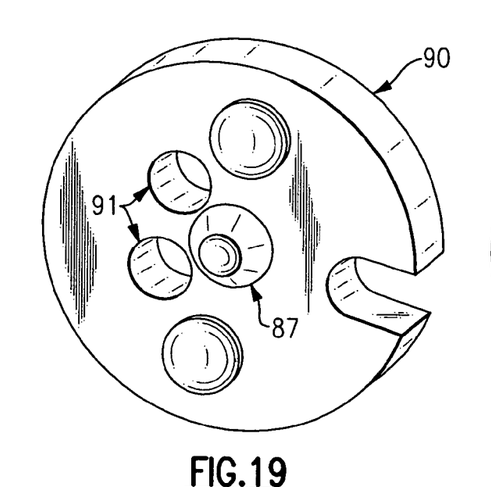
FIG. 19 is a perspective view of showing a ninth shield embodiment.

FIG. 19 illustrates yet another embodiment of the invention in which the isolation shield 90 includes one or more holes 91 are located adjacent to the barrier 87. In this embodiment, the holes are depicted as round through-bores substantially parallel to the common axis, however, the invention contemplates holes of various shapes, sizes and orientations.

Figure 20:
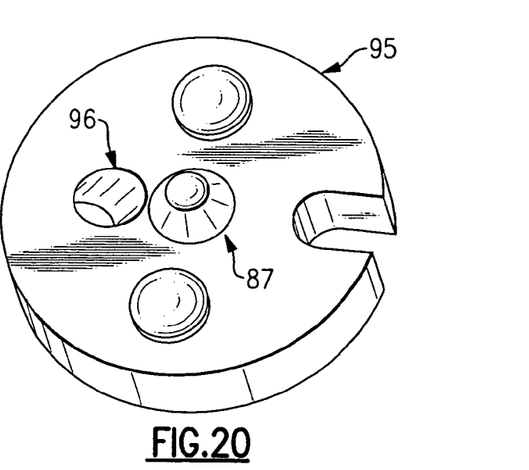
FIG. 20 is a perspective view of showing a tenth shield embodiment.
Figure 21:
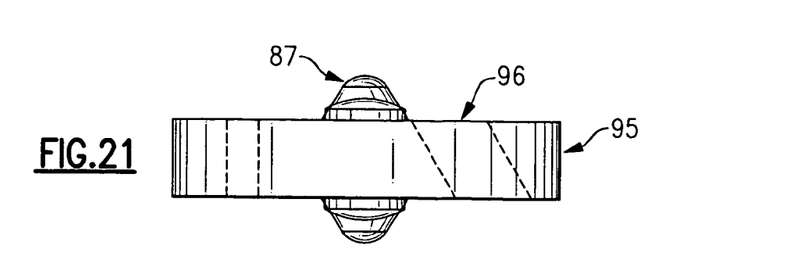
FIG. 21 is a side elevation of the shield shown in FIG. 20.

FIGS. 20 and 21 illustrate a further embodiment of the invention in which the isolation shield 95 includes at least one hole adjacent to the barrier 87 and which is aligned to be not parallel to or skewed from the common central axis of the filter assembly. The skewed hole 96 will similarly engage the advancing tool and further direct the tool off-center, inducing breakage thereof and preventing the formation of a passage along the common axis of the filter.

Although a number of different barrier configuration have been disclosed herein, these disclosures are not exhaustive and any type of barrier that can resist penetration by a cutting tool such as a drill bit and direct the tool away from the central axis of the filter to induce tool breakage can be employed in the practice of the present invention.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. A tamper-resistant filter assembly comprising:
a filter housing having two ends and a central axis;
a first connector mounted to a first end of said filter housing having an opening that is aligned along said central axis for receiving therein a first conductor carrying a network provider's available signals;
a second connector mounted to a second end of said filter housing having an opening that is aligned along said central axis for receiving therein a second conductor carrying the signals to a subscriber;
a barrier mounted within said filter housing aligned along said central axis between the first and second connectors for intercepting a cutting tool that is passed into one of the connector openings and preventing said tool from reaching said other connector opening.

2. The assembly of claim 1 wherein said barrier is mounted on a plate within the filter housing, said plate having at least one off-axis opening adjacent to said barrier for engaging said intercepted cutting tool and directing said tool away from said central axis.

3. The assembly of claim 2 wherein said barrier is a dome shaped member wherein an apex of said dome shaped member is aligned on said central axis whereby said tool intercepted by the member is directed away from said central axis.

4. The assembly of claim 2 wherein said barrier is a cone shaped member wherein an apex of said cone shaped member is aligned on said central axis whereby said tool intercepted by the member is directed away from said central axis.

5. The assembly of claim 2 wherein said barrier includes a flat inclined surface that passes through the central axis for directing said tool away from said central axis.

6. The assembly of claim 2 wherein said barrier is a rod that is axially aligned along said central axis and which terminates with a pointed tip whereby said tool that is intercepted by said rod is directed away from said central axis.

7. The assembly of claim 2 wherein said barrier is a flat topped member having a channel formed in the top surface of the member which passes through said central axis, said channel being arranged to engage said cutting tool moving along said central axis and directing the tool away from said central axis.

8. The assembly of claim 2 wherein said barrier includes a convex top surface that passes through said central axis whereby said cutting tool that is intercepted by said convex surface is directed away from said central axis.

9. The assembly of claim 1 wherein said filter housing further comprises at least two housing sections and said barrier is mounted on an isolation shield between said housing sections.

10. The assembly of claim 9 wherein at least one off-axis opening in said shield is adjacent to said barrier for engaging said intercepted cutting tool and directing said tool away from said central axis.

11. The assembly of claim 10 wherein said-off-axis opening is aligned to be not parallel to said central axis.

12. The assembly of claim 10 wherein said barrier and said off-axis opening induce breakage of said cutting tool.

13. The assembly of claim 9 wherein said opening in said shield is in the shape of a slot.

14. The assembly of claim 13 wherein said slot is aligned radially to the central axis.

15. The assembly of claim 9 wherein said shield has a series of keys which mate in keyways formed in each of the two filter housing sections.

16. The assembly of claim 9 wherein said shield has an off-axis opening passing through the shield whereby an electrical lead can be extended between the housing sections through said off-axis opening.

17. A tamper resistant filter assembly for protecting against theft of service from a cable system, said filter assembly comprising:
    first and second filter housing sections that are coaxially aligned end to end along a common axis;
    said first housing section operably connected to a first connector having an opening that is aligned along said common axis for receiving therein a conductor carrying a network provider's available signals;
    said second housing section operably connected to a second connector having an opening that is aligned along said common axis for receiving therein a conductor carrying the signals to a subscriber;
    an isolation shield having opposed end faces disposed between the first and second housing filter sections;
    a barrier means mounted upon at least one end face of said shield for intercepting a cutting tool that is moved into one of the connector openings along said common axis; and
    a means for directing said intercepted cutting tool away from said common axis whereby said tool is prevented from reaching said other connector opening.

18. A method of protecting against theft of service from a cable system including the steps of:
    providing a filter housing containing a filter network, said housing having two ends and a central axis, a first connector mounted to a first end of said filter housing, a second connector mounted to a second end of said filter housing, and a barrier mounted within the filter housing wherein said connectors and said barrier are aligned along said central axis;
    intercepting a cutting tool that is inserted through one of said connectors with said barrier; and
    redirecting the cutting tool away from the central axis thus preventing the formation of a passageway along the central axis through which a conductor is inserted to by pass said filter network.

19. The method of claim 18 that includes the further step of mounting the barrier upon a plate within said housing, said barrier having a convex structure aligned with the central axis on each side of said plate.

20. The method of claim 19 that includes the further steps of providing at least one opening through said plate adjacent to said barrier; and engaging said intercepted cutting tool with said opening to further direct said cutting tool away from the central axis.

21. The method of claim 19 that includes the further steps of inducing breakage of said intercepted tool.

* * * * *

UNITED STATES PATENT AND TRADEMARK OFFICE
CERTIFICATE OF CORRECTION

PATENT NO. : 7,265,646 B2 Page 1 of 1
APPLICATION NO. : 11/070984
DATED : September 4, 2007
INVENTOR(S) : Charles N. Lanz and Eric J. Purdy

It is certified that error appears in the above-identified patent and that said Letters Patent is hereby corrected as shown below:

In the BRIEF DESCRIPTION OF THE DRAWINGS, the following mistakes have been noted:
 i) Col. 3, Lines 24 and 25. The words "illustrated in FIG. 6;" should be deleted and replaced with -- illustrated in FIG. 7;--.
 ii) Col. 3, Line 26. The words "illustrating a forth" should be deleted and replaced with -- illustrating a fourth--.
 iii) Col. 3, Lines 29 and 30. The words "illustrated in FIG. 8;" should be deleted and replaced with -- illustrated in FIG. 9;--.
 iv) Col. 3, Line 44. The words "showing a eighth shield" should be deleted and replaced with -- showing an eighth shield--.

Figure 17:
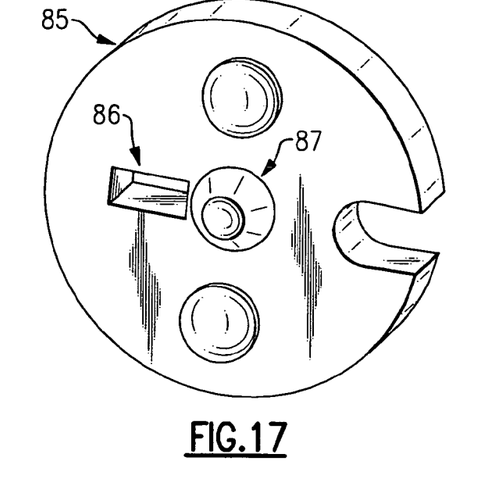
FIG. 17 is a perspective view of showing a seventh shield embodiment.

In the DETAILED DESCRIPTION OF THE INVENTION, the following mistakes have been noted:
 i) Col. 5, Lines 22 and 23. The words "FIG. 18 illustrates a further embodiment of the invention in which an insulation shield" should be deleted and replaced with --FIG. 17 illustrates a further embodiment of the invention in which an isolation shield--.
 ii) Col. 5, Line 62. The words "configuration have" should be deleted and replaced with --configurations have--.

Signed and Sealed this

Twentieth Day of November, 2007

JON W. DUDAS
*Director of the United States Patent and Trademark Office*